(12) United States Patent
Puscasu

(10) Patent No.: US 10,320,346 B2
(45) Date of Patent: Jun. 11, 2019

(54) BIDIRECTIONAL CURRENT SENSE AMPLIFIER

(71) Applicant: SEMICONDUCTOR COMPONENTS INDUSTRIES, LLC, Phoenix, AZ (US)

(72) Inventor: Razvan Puscasu, Targoviste (RO)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/877,804

(22) Filed: Jan. 23, 2018

(65) Prior Publication Data
US 2019/0068144 A1    Feb. 28, 2019

Related U.S. Application Data

(60) Provisional application No. 62/549,411, filed on Aug. 23, 2017.

(51) Int. Cl.
| | |
|---|---|
| *H03F 1/02* | (2006.01) |
| *H03F 3/393* | (2006.01) |
| *H03F 3/45* | (2006.01) |
| *H03F 3/62* | (2006.01) |

(52) U.S. Cl.
CPC .......... *H03F 3/393* (2013.01); *H03F 1/0233* (2013.01); *H03F 3/4521* (2013.01); *H03F 3/62* (2013.01); *H03F 2200/271* (2013.01); *H03F 2200/462* (2013.01)

(58) Field of Classification Search
CPC .............. H03F 1/02; H03F 3/005; H03F 3/45
USPC ........................................ 330/9, 253
See application file for complete search history.

(56) References Cited

U.S. PATENT DOCUMENTS

| | | | |
|---|---|---|---|
| 7,265,615 B2* | 9/2007 | Alexander | H03F 1/14 330/69 |
| 10,097,146 B2* | 10/2018 | Stan | H03F 3/387 |
| 2008/0018392 A1* | 1/2008 | Nolan | H03F 3/45986 330/9 |
| 2009/0153241 A1 | 6/2009 | Trifonov | |
| 2009/0174479 A1 | 7/2009 | Yon et al. | |
| 2010/0164631 A1 | 7/2010 | Schneider et al. | |
| 2015/0207477 A1 | 7/2015 | Stanescu | |

* cited by examiner

*Primary Examiner* — Steven J Mottola
(74) *Attorney, Agent, or Firm* — Brake Hughes Bellermann LLP

(57) ABSTRACT

In a general aspect, a current sense amplifier circuit (CSA) can include a null amplifier path and a main amplifier path that are both configured to receive a differential input voltage. The null amplifier path can output a first differential output voltage based on the differential input voltage. The main amplifier path can also be configured to receive the first differential output voltage and output a second differential output voltage based on the differential input voltage and the first differential output voltage. The null and main amplifier paths can each include a differential amplifier having first and second input stages that are each configured to receive the differential input voltage. The first input stage and the second input stage of the main amplifier path can and be powered by a respective (first and second) floating voltage supply rails that are referenced to a floating ground rail.

20 Claims, 7 Drawing Sheets

BIDIRECTIONAL CURRENT SENSE AMPLIFIER

CROSS REFERENCE TO RELATED APPLICATION

This application claims priority to and the benefit of U.S. Provisional Application No. 62/549,411, filed Aug. 23, 2017, entitled "DEVICE AND CIRCUIT IMPROVEMENTS", which is hereby incorporated by reference in its entirety.

TECHNICAL FIELD

This description relates to circuits for determining a current supplied to a circuit load. More specifically, this description relates to current sense amplifier circuits (e.g., shunt amplifiers) that can determine and amplify a differential voltage across a sense resistor, where the amplified voltage can be used to determine the supplied current.

SUMMARY

In a general aspect, a current sense amplifier circuit (CSA) can include a null amplifier path configured to receive a differential input voltage and to output a first differential output voltage based on the differential input voltage. The CSA can also include a main amplifier path configured to receive the differential input voltage; receive the first differential output voltage; and output a second differential output voltage based on the differential input voltage and the first differential output voltage. Each of the null amplifier path and the main amplifier path can include a differential amplifier having a first input stage and a second input stage that are each configured to receive the differential input voltage. The first input stage of the main amplifier path can be powered by a first floating voltage supply rail that is referenced to a floating ground rail. The second input stage of the main amplifier path can be powered by a second floating voltage supply rail that is referenced to the floating ground rail.

In another general aspect, a current sense amplifier circuit (CSA) can include a null amplifier path configured to receive a differential input voltage and to output a first differential output voltage based on the differential input voltage. The CSA can also include a main amplifier path configured to receive the differential input voltage; receive the first differential output voltage; and output a second differential output voltage based on the differential input voltage and the first differential output voltage. Each of the null amplifier path and the main amplifier path can include a differential amplifier having a first input stage configured to receive the differential input voltage, and a second input stage configured to receive the differential input voltage. The differential amplifiers of the null amplifier path and the main amplifier path can also each include (or at least one can include) a transconductance compensation circuit that can be coupled between the first input stage and the second input stage. The transconductance compensation circuit can be configured to control operation of the second input stage based on operation of the first input stage.

In another general aspect, a current sense amplifier circuit (CSA) can include a null amplifier path configured to receive a differential input voltage and to output a first differential output voltage based on the differential input voltage. The CSA can also include a main amplifier path configured to receive the differential input voltage; receive the first differential output voltage; and output a second differential output voltage based on the differential input voltage and the first differential output voltage. Each of the null amplifier path and the main amplifier path can include a differential amplifier having a first input stage and a second input stage that are each configured to receive the differential input voltage. The first input stage of the main amplifier path can be powered by a first floating voltage supply rail that is referenced to a floating ground rail. The second input stage of the main amplifier path can be powered by a second floating voltage supply rail that is referenced to the floating ground rail. The first input stage of the null amplifier path can be powered by a third floating voltage supply rail that is referenced to the floating ground rail. The second input stage of the null amplifier path being powered by a fourth floating voltage supply rail that is referenced to the floating ground rail.

BRIEF DESCRIPTION OF THE DRAWINGS

Like reference symbols in the various drawings indicate like and/or similar elements.

DETAILED DESCRIPTION

Figure 1:
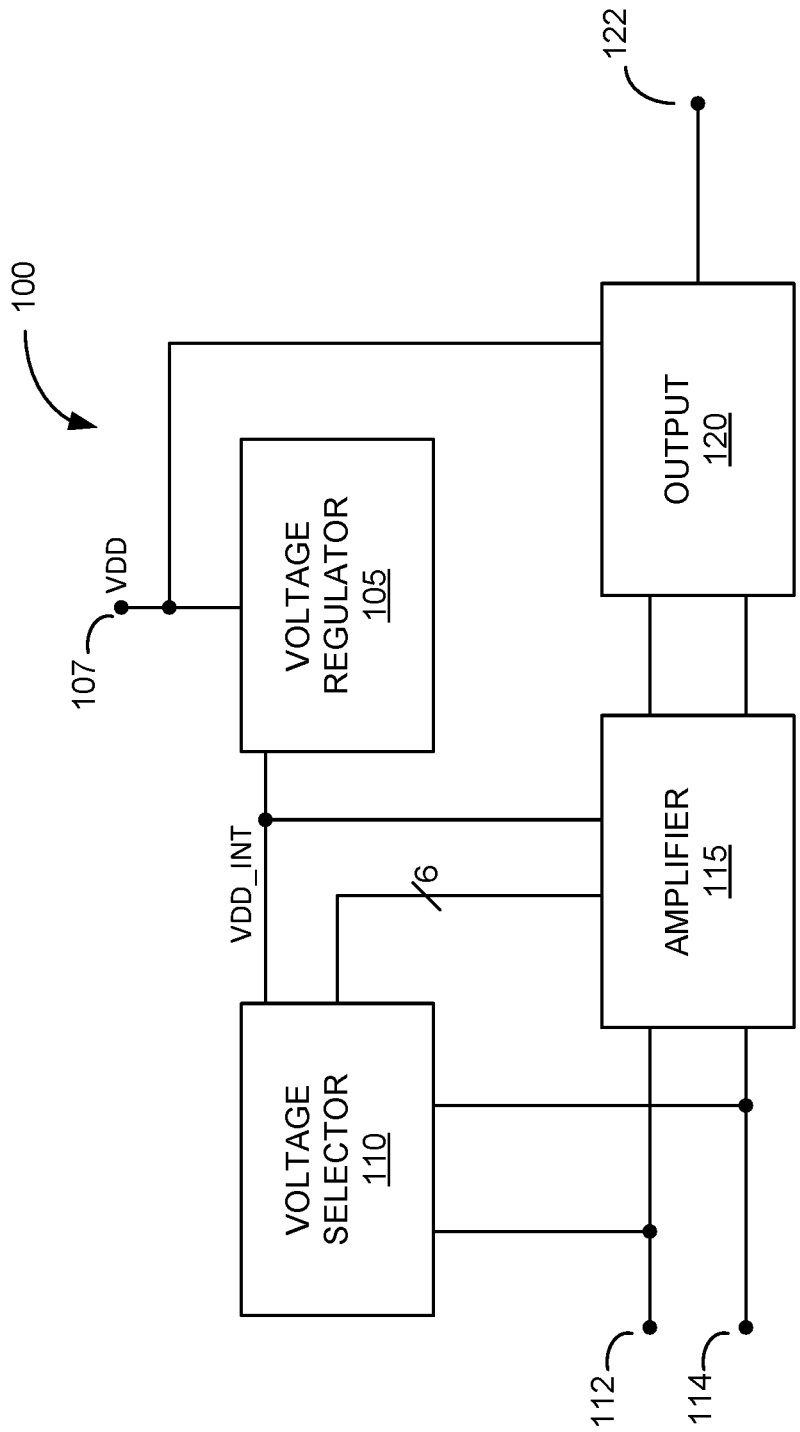
FIG. 1 is a block diagram illustrating a current sense amplifier.

Current sense amplifiers (CSAs), which can also be referred to as shunt amplifiers, have a wide range of applications in different technology areas. For instance, CSAs can be used in telecommunications, power management, industrial electronics, etc. CSAs can be used, for example, to sense a current (e.g., a current delivered to a circuit load) based on a differential voltage across a sense (shunt) resistor (e.g., to determine the current through the sense resistor that is delivered to the circuit load). For instance, a differential voltage across a sense resistor can be applied to differential inputs of a CSA. The CSA can then amplify that differential voltage to produce an amplified output voltage (e.g., a single-ended voltage) that is directly proportional (e.g., by an amplification factor of the CSA) to the sensed differential input voltage. The sensed current (through the sense resistor and delivered to the circuit load) can then be determined based on the amplified output voltage, the amplification factor and the value of the sense resistor.

To provide a differential voltage to a CSA, a sense resistor (e.g., which can have a resistance value that is negligible compared to an impedance of a circuit load for which a current is being sensed) can be coupled in series with the circuit load of interest (e.g., between the circuit load and a voltage supply providing current to the circuit load). A potential of the voltage source supplying the circuit load of interest can be referred to as a common mode voltage of a CSA that is measuring (sensing) a current being suppled to the circuit load by the voltage source.

The CSAs described herein can have the ability to sense current for common mode voltages that are both within (less than or equal to) a supply voltage range of a given CSA, and common mode voltages that exceed (are greater than) a supply voltage range of the given CSA, where the supply voltage of the CSA can be an externally applied supply voltage, or an internally regulated supply voltage of the CSA. The externally applied supply voltage and the internally regulated supply voltage can be respectively referred to (e.g., for purposes of this disclosure) as VDD and VDD_INT of the CSA. The CSAs described herein can have bi-directional current sensing capability, where a CSA is able to provide an amplified (e.g., single-ended) output voltage (corresponding with a sensed differential voltage) regardless of the direction of current flow through an associated sense resistor that produces the sensed differential voltage.

Additionally, the CSAs described herein can provide isolation between their input voltage range (e.g., a common mode voltage range of a given CSA) and their output voltage range (e.g., an operating voltage range of the given CSA). For instance, a given CSA can operate to translate (shift) its input signals (e.g., differential input signals) into the CSA's operating voltage range (e.g., when the input signals are outside the operating voltage range of the CSA, such as for common mode voltages that are greater than an operating voltage of a given CSA). The foregoing described operational aspects of a CSA can be achieved while meeting accuracy/precision specifications (expectations) for a given CSA application. For instance, it may be desirable that any current sensing errors introduced by a given CSA are comparable to, or less than any errors that are introduced by the precision/variation of an associated sense resistor used to provide a differential voltage for the CSA.

In some implementations, the CSAs described herein can be dual-path, differential current sense amplifiers, which include a main (e.g., a feed-forward) amplifier path in parallel with a null (e.g., chopper-stabilized) input path. Such implementations allow for precise, bi-directional sensing and amplification of a differential voltage associated with a current through a sense resistor, regardless of a direction of current flow in the sense resistor (and associated polarity of the differential voltage).

Further, in implementations described herein, the null and main amplifier paths can be implemented using differential amplifiers that each includes a plurality of input stages. In such implementations, a first input stage of the plurality of input stages for a given differential amplifier can be powered by a voltage that is applied on a first floating power supply rail, where the applied voltage is determined based on a corresponding common mode voltage (e.g., a voltage applied to a given differential input of the CSA). A second input stage of the plurality of input stages for a given differential amplifier can be powered by a voltage applied on a second floating power supply rail that is the greater of an internal operating voltage (VDD_INT) of the CSA and the applied common mode voltage (e.g., the voltage applied to a given differential input of the CSA). Also in implementations described herein, a ground reference of the input stages that are powered by the different floating power supply voltage rails can be determined from either the common mode voltage (e.g., the voltage applied to the given differential input of the CSA) or VDD_INT of the CSA, whichever is greater. Such approaches will allow for accurate translation (shifting) of the input signals into the operating voltage supply range (e.g., VDD_INT) of the CSA (e.g., when a common mode voltage of the differential input voltage is greater than VDD_INT). In some implementations, the floating power supply rails can be referenced to a floating ground supply rail, where a voltage potential applied to a given stage, or portion of the CSA, that is powered by one of the floating power supply rails can be a potential difference between the respective floating power supply rail and the floating ground supply rail. As described herein, other voltage supply rails and ground references can be implemented in a CSA.

Also, in implementations described herein, linearity (e.g., transconductance of the plurality of input stages) of both differential amplifiers (e.g., the main amplifier path and the null amplifier path) across an input common mode voltage range for a corresponding CSA can be achieved using an input stage transconductance (gm) compensation (e.g., gm control) circuit, which can improve current sensing precision of the CSA implementations described herein, as compared to current CSA implementations.

FIG. 1 is a block diagram illustrating a current sense amplifier (CSA) 100. As shown in FIG. 1, the current sense amplifier 100 includes a voltage regulator 105, a voltage selector 110, an amplifier 115 and an output stage 120. The CSA 100 also includes a voltage supply terminal 107 coupled with the voltage regulator 105, differential input terminals 112 and 114 coupled with the voltage selector 110 and the amplifier 115 and an output terminal 122. The CSA 100 can be configured to output, on the output terminal 122, an amplified version (e.g., a single-ended version) of a differential voltage applied across the differential input terminals 112 and 114. That is, the CSA 100 can sense, through a sense resistor coupled between the terminals 112 and 114, a current suppled to a circuit load from a voltage source at a common mode voltage, and provided and provide an amplified, single-ended version of that voltage. The amplified, single-ended voltage can than be used to determine the current supplied to the circuit load.

In the CSA 100, the voltage supply terminal 107 can be configured to receive an externally supplied voltage (e.g., VDD) and the voltage regulator 105 can regulate that externally supplied voltage to supply a consistent, internal supply voltage (e.g., VDD_INT) for the CSA 100, such as in response to load conditions. In certain implementations, the voltage regulator 105 could also step down (reduce) the externally supplied voltage when providing VDD_INT. For example, the voltage regulator 105 could step-down a VDD voltage of 5V to a VDD_INT voltage of 3.3 V or 1.8 V in some implementations. As shown in FIG. 1, the voltage regulator 105 in the CSA 100 is coupled with the voltage selector 110 and the amplifier 115, e.g., to provide the VDD_INT voltage. In certain implementations, VDD can be provided as the internal supply voltage VDD_INT.

In the CSA 100, the voltage selector 110 is further coupled with the input terminals 112 and 114 (e.g., to receive a differential voltage applied across a sense resistor). As described herein, in certain implementations, one or more portions (e.g., input stages, chopper circuits, etc.) of the amplifier 115 can be powered (supplied, etc.) from the common mode voltage, e.g., from a plus differential input (e.g., IN+, INP, etc.) such as the terminal 112, or from a minus differential input (e.g., IN−, INM, etc.), such as the terminal 114. In some implementations, such as the CSA implementations described herein, a differential voltage applied to the differential inputs of the CSA (e.g., a voltage difference between a voltage on the terminal 112 and a voltage on the 114) will be relatively small as compared to an associated common mode voltage and/or VDD_INT. For instance, in certain implementations, the differential voltage can be on the order of a few millivolts (mV) to hundreds of mV. In some implementations, other differential voltages are possible.

For purposes of this disclosure, it can be presumed that a differential voltage applied to the input terminals 112 and 114 of the CSA 100 (or other CSA implementations described herein) is relatively small as compared to a corresponding common mode voltage and/or VDD_INT used to power portions of the CSA. Accordingly, portions of the amplifier 115 referred to as being powered by the common mode voltage can also refer to implementations where those portions of the amplifier 115 are powered by a voltage applied to a respective differential input terminal (e.g. the terminal 112 or the terminal 114). For purposes of operating precision, any difference between a common mode voltage and the associated differential voltage applied across the differential input terminals (presuming the difference is sufficiently small) can be accounted for (e.g., cancelled out). For instance, such canceling can be affected by operational tolerances of differential amplifiers included in the amplifier 115. That is, those portions of such differential amplifiers can be considered to be operating at the applied common mode voltage, even though current may be supplied from either an IN+ differential input (e.g., the terminal 112) or and IN− differential input (e.g., the terminal 114), depending on the particular situation and architecture of the amplifier 115.

As shown in FIG. 1, the voltage selector 110 can be coupled with the amplifier 115 to provide a plurality of voltage supply signals. In the particular implementation of FIG. 1, the voltage selector 110 is illustrated as being configured to provide six voltage supply signals to the amplifier 115, such as in the example voltage selector implementation shown in FIG. 3 and described further below. In certain implementations, the voltage selector 110 can be an analog selection circuit that can, for example, provide one or more floating power supply rail voltages that provide the larger voltage of the common mode voltage and a voltage of VDD_INT selected by the voltage regulator 110 (e.g., a larger of a voltage applied on the input terminal 112 and VDD_INT, or a larger of a voltage applied on the input terminal 114 and VDD_INT). In certain implementations (e.g., such as depending on a semiconductor technology that is used to implement the CSA 100), VDD can vary from 2.2V to 26V, VCM can vary from 0V to 26V (e.g., independent of VDD), and VDD_INT can vary from 2.2V (e.g., when VDD=2.2V) to 5V (e.g., when VDD=26V). In some implementations, when VDD is between, 2.2 V and 5 V, VDD_INT can follow VDD, and when VDD is greater than 5V, VDD_INT can be clamped at 5V (e.g., by a voltage regulator included in the voltage selector block 110, such as discussed below with respect to FIG. 3).

The voltage selector 110 can also be configured to provide, to the amplifier 115, one or more floating power supply rails (e.g., three floating power supply rails) that follow a common mode voltage of a differential voltage that is applied to the terminals 112 and 114. The voltage selector 110 can be further configured to provide, to the amplifier 115, a floating ground reference on a floating ground supply rail, where the floating ground reference is determined from the larger of the common mode voltage and VDD_INT (e.g., from the IN+ voltage, the IN− voltage and VDD_INT).

As also illustrated in FIG. 1, the voltage regulator 105 can be coupled with the amplifier 115. In certain implementations, the voltage regulator 105 can supply VDD_INT to the amplifier and the amplifier 115 can use VDD_INT to directly power one or more portions of the amplifier (e.g., rather than using a voltage received from the voltage selector 110). For instance, the amplifier 115 can use VDD_INT provided directly by the voltage regulator 105 to power an input stage (e.g., a secondary input stage) of a differential amplifier of a main (feed-forward) amplifier path, such as is described in further detail below and illustrated, at least, in FIG. 5.

As also shown in FIG. 1, the input terminals 112 and 114 (e.g., IN+ and IN− differential input terminals) can also be coupled with differential inputs of the amplifier 115 to provide a differential voltage on the input terminals 112 and 114 to the amplifier 115. The amplifier 115, as illustrated in FIG. 1, can also be coupled (e.g., differentially coupled) with the output stage 120, where the amplifier 115 provides, to the output stage 120, an amplified, differential version of the differential input voltage applied to the terminals 112 and 114. The output stage 120, of the CSA 100, can be configured to provide a single-ended amplified version of the differential input voltage applied to the input terminals 112 and 114 based on the amplified, differential version provided by the amplifier. The amplified, single-ended voltage can then be used to determine a current associated with the differential input voltage (e.g., a current through a sense resistor).

Figure 2:
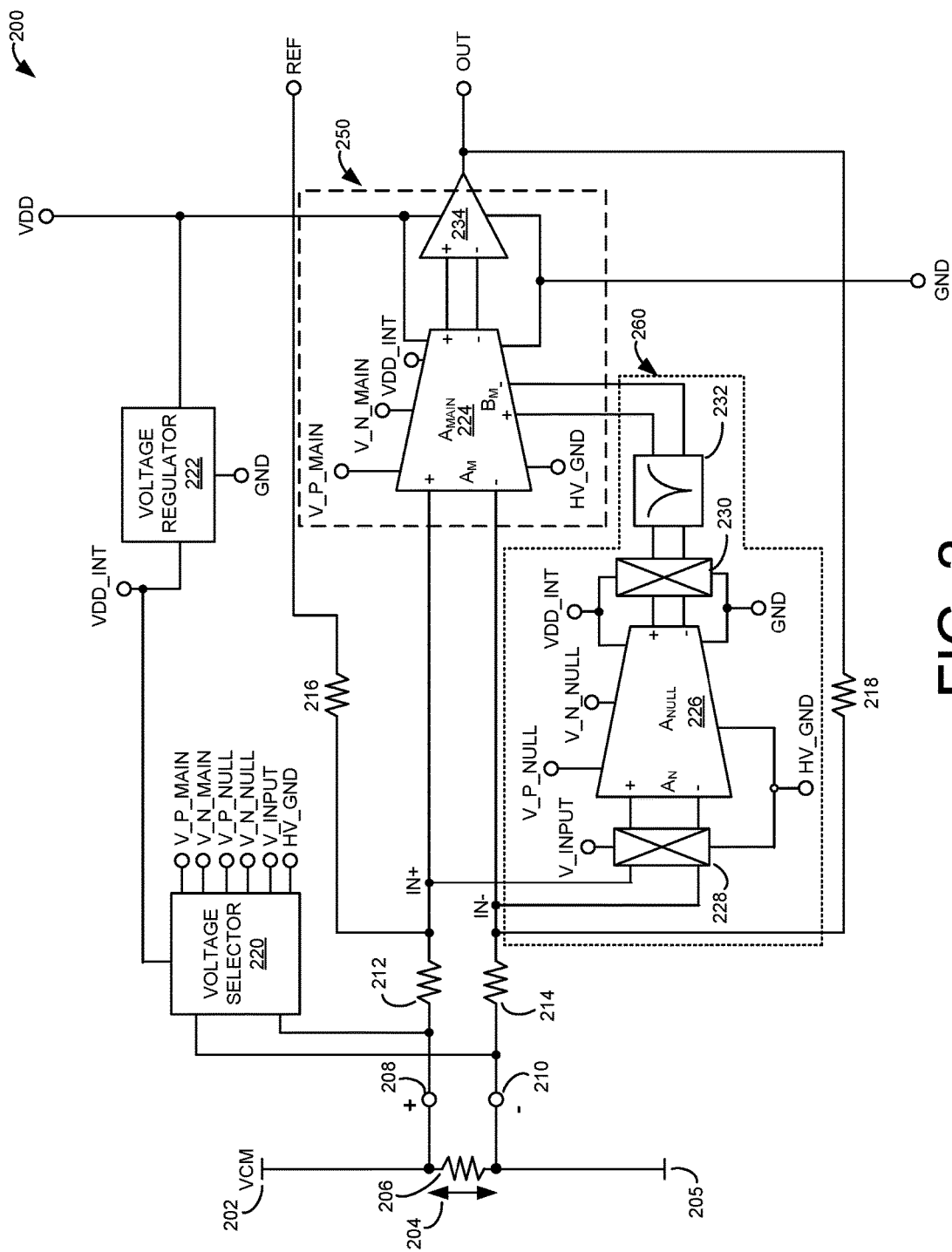
FIG. 2 is a schematic diagram illustrating an implementation of the current sense amplifier of FIG. 1.

FIG. 2 is a schematic diagram illustrating an implementation of a CSA 200 that can be used to implement the CSA 100 of FIG. 1. In the CSA 200, a common mode voltage VCM can be applied to a terminal 202 and VCM can provide a supply current 204 to a circuit load that is coupled with a terminal 205. A current (e.g., a positive or negative current) supplied to the circuit load that is coupled with the terminal 205 can be conducted through a sense resistor 206. A voltage (differential voltage) across the sense resistor 206 can be applied to differential input terminals 208 (e.g., an IN+ terminal) and 210 (e.g., an IN− terminal) of the CSA 200.

The differential voltage applied to the terminals 208 and 210 (shown as + and − in FIG. 2) can, via resistors 212 and 214 (which can be of a same resistance value), be provided to (communicated to, etc.) a main (feed-forward) amplifier path 250 and a null (chopper-stabilized) amplifier path 260 of the CSA 200. The null and main amplifier paths of the CSA 200 can, in conjunction provide an amplified (single-ended version) of the differential input voltage applied across (to, etc.) the terminals 208 and 210 on an output terminal OUT. A reference signal REF can be provided to the IN+ terminal via a resistor 216. The REF signal can be used to set an output common mode voltage for the CSA 200. Feedback of the OUT terminal (of the output stage 234) of the CSA 200 can be provided to the IN− terminal via a resistor 218. As shown in FIG. 2, an externally supplied power supply voltage VDD and an externally applied ground reference GND can be applied to (provided to, etc.) the CSA 200.

Figure 3:
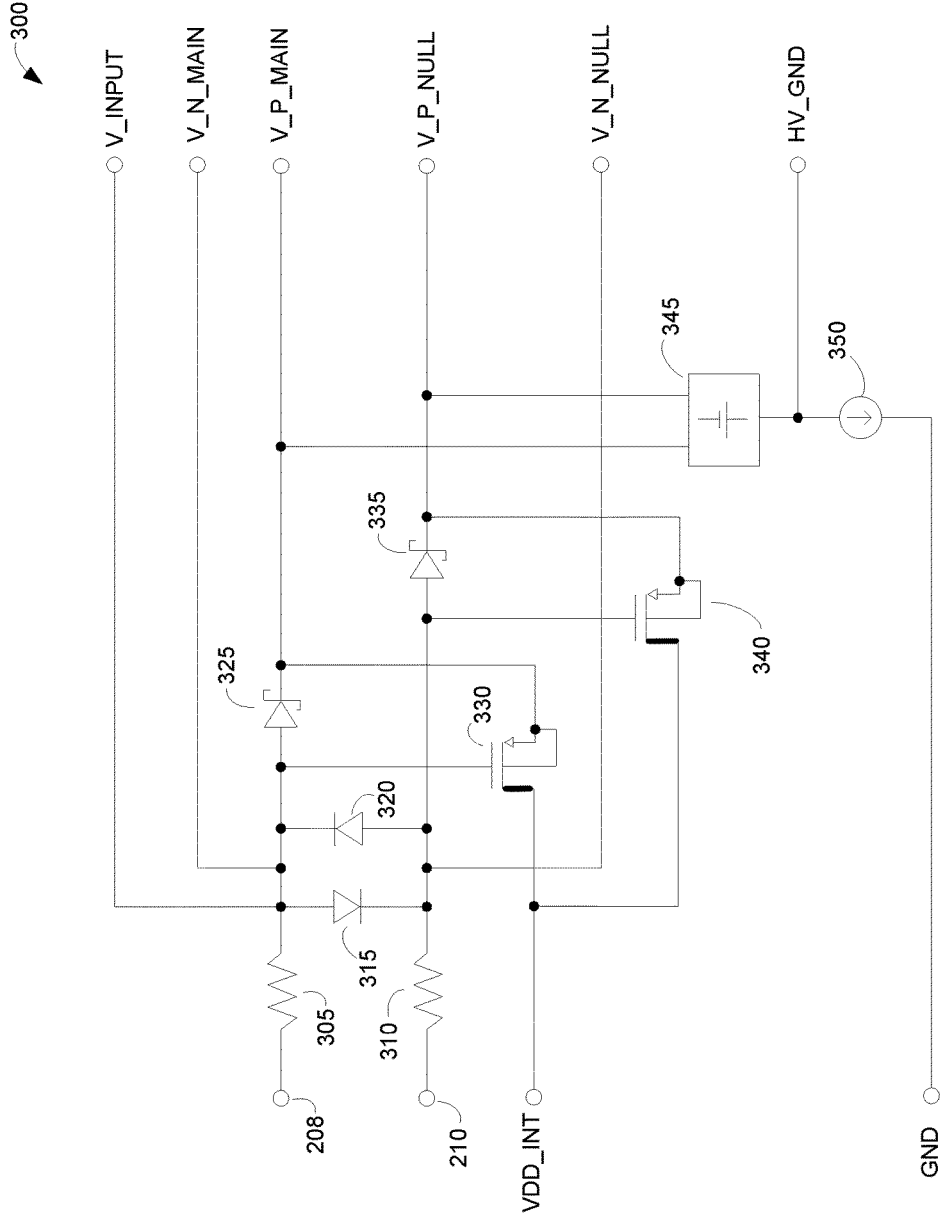
FIG. 3 is a schematic diagram illustrating a voltage selector circuit that can be implemented in the current sense amplifier of FIG. 2.

The CSA 200 can include a voltage selector 220 that can provide a plurality of floating voltage supply rails (V_P_MAIN, V_N_MAIN, V_P_NULL, V_P_NULL and V_INPUT), as well as a floating ground reference HV_GND, such as supplied by the voltage selector block 220 and described herein. The CSA 200 can also include a voltage regulator 222 that is configured to provide (generate, etc.) an internal supply voltage VDD_INT, which can be a regulated version of VDD. Depending on the particular implementation, VDD_INT and VDD can be approximately equal, or VDD_INT can be stepped down (less than) VDD, such as described above. The floating voltage supply rails and the floating ground supply rail of the voltage selector 220 can, in combination with VDD, VDD_INT and GND, provide power and ground references to the various elements of the main and null amplifier paths of the CSA 200, such as is illustrated in FIG. 2, and discussed further with respect to FIGS. 5 and 6. An example implementation of the voltage selector 220 is illustrated in FIG. 3, and described further below.

As shown in FIG. 2, the null (chopper-stabilized) amplifier path of the CSA 200 can include an input chopper (e.g., including a plurality of pass gate switches) 228 that is powered by the floating voltage rail V_INPUT that is referenced to the floating ground reference HV_GND. The input chopper can receive the differential voltage (e.g., from the IN+ and IN− terminals) and provide a chopped version of the differential voltage to differential inputs $A_N$ (+ and − inputs) of a differential amplifier $A_{NULL}$ 226. As shown in FIG. 2, the $A_{NULL}$ amplifier 226 can be coupled with the floating voltage supply rails V_P_NULL and V_N_NULL, the floating ground reference HV_GND, VDD_INT and the externally applied ground reference GND.

The $A_{NULL}$ amplifier 226 can provide an amplified version of the chopper version of the differential voltage received from the input chopper 228 to an output chopper 230, where the output chopper can be powered by VDD_INT and GND. The output chopper 230 can provide an output chopped version of the amplified differential voltage received from the $A_{NULL}$ amplifier 226 to a notch filter 232. In certain implementations, other filters can be used, such as a low-pass filter. In the CSA 200, the notch filter 232 (or other filter) can remove offset and noise of $A_{NULL}$ amplifier 226 to provide a filtered version of the amplified differential voltage generated by the $A_{NULL}$ amplifier 226. In the CSA 200, the notch filter 232 can then provide the filtered version of the differential voltage (which can be referred to as an output differential voltage of the null amplifier path, a first differential output voltage, etc.) to an $A_M A_{IN}$ amplifier 224 of a main (feed-forward) amplifier path of the CSA 200.

Figure 5:
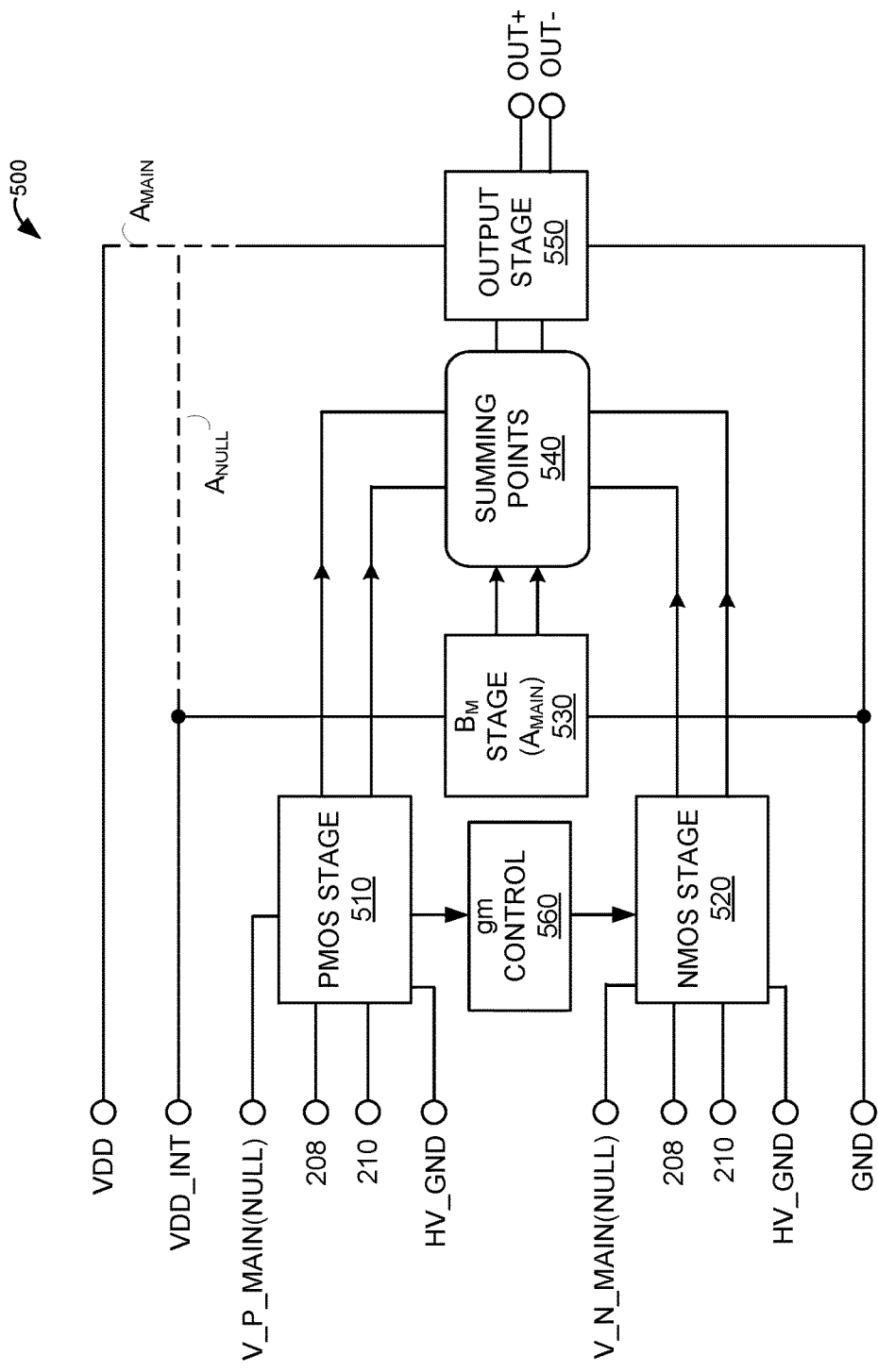
FIG. 5 is a block diagram illustrating a differential amplifier that can be implemented in the current sense amplifier of FIG. 2.
Figure 6:
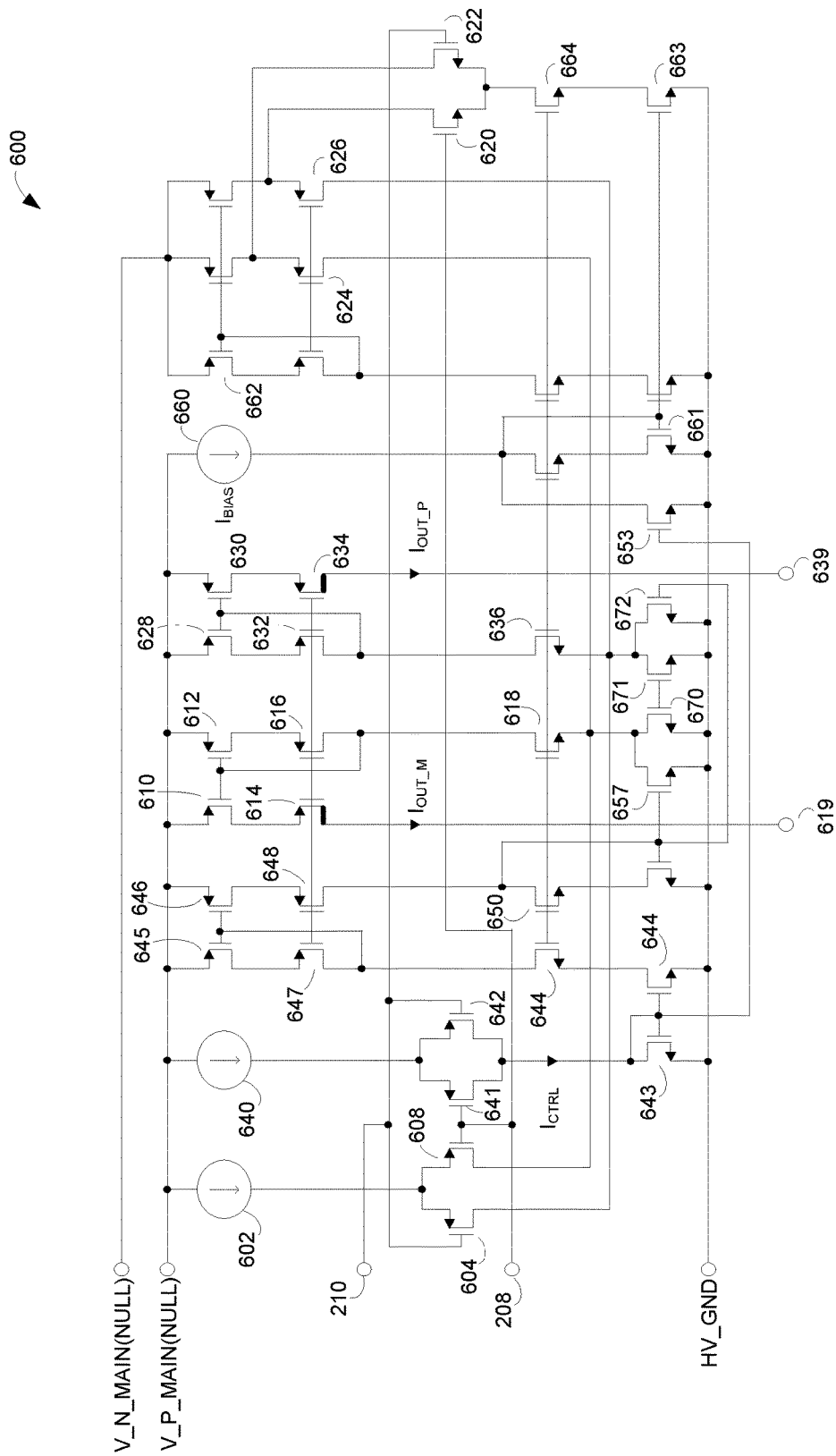
FIG. 6 is a schematic diagram illustrating input stages and a transconductance control circuit that can be implemented in the differential amplifier of FIG. 5.

The first differential output voltage (e.g., from the notch filter 232 of the null amplifier path) can be received at differential inputs (+ and − inputs) of an auxiliary input stage $B_M$ of the $A_{MAIN}$ amplifier 224. The $A_{MAIN}$ amplifier 224 can also receive the differential input voltage (e.g., from the IN+ and IN− terminals) at differential inputs (+ and − inputs) one or more inputs stages (e.g., a PMOS input stage and a NMOS input stage, as described herein) of the $A_{MAIN}$ amplifier 224. As shown in FIG. 2, the $A_{MAIN}$ amplifier 224 of the CSA 200 can be powered by the V_P_MAIN rail, the V_N_MAIN rail, VDD_INT, VDD, HV_GND and GND. Such biasing can provide for shifting voltage levels of differential input signal (e.g., for common mode voltages VCM that are greater than VDD_INT) into the operating voltage range of the CSA 200. An example implementation of the $A_{MAIN}$ amplifier 224 and the $A_{NULL}$ amplifier 226 is shown in FIGS. 5 and 6, and described further below.

In the CSA 200, the $A_{MAIN}$ amplifier 224 can provide a second differential output voltage to the differential inputs (e.g., + and − inputs) of an output stage 234, and the output stage 234 can provide a singled ended amplified version of the second differential output voltage on the OUT terminal of the CSA 200. As noted above, the single-ended output voltage provided by the output stage 234 of the CSA 200 can be directly and/or precisely proportional to the differential input voltage that is applied to the input terminals 208 and 210 of the CSA 200. The single-ended output voltage produced by the output stage 234 can then be used to determine the current 204 through the sense resistor 206, e.g., based on an amplification factor of the CSA 200, a value of the single-ended voltage and a resistance of the sense resistor 206.

FIG. 3 is a schematic diagram illustrating a voltage selector circuit 300 that can be implemented as the voltage selector 220 in the CSA 200 of FIG. 2 (or as the voltage selector 110 in the CSA 100 of FIG. 1). As shown in FIG. 3, the voltage selector 300 includes differential input terminals that are common (coupled with) the differential input terminals 208 (e.g., IN+) and 210 (IN−) of the CSA 200 as shown in FIG. 2, as well as a VDD_INT input terminal, which can be configured to receive the VDD_INT voltage (VDD_INT) from a voltage regulator of a corresponding CSA, such as the voltage regulator 222 of the CSA 200. As also shown in FIG. 3, the voltage selector 300 includes a GND input terminal receiving an externally supplied ground reference, the HV_GND reference of FIG. 2, for a corresponding CSA.

In the voltage selector 300, voltages of a differential input voltage that are applied to the differential input terminals 208 and 210 of the voltage selector 300 are conducted, respectively, through resistors 305 and 310, which can be of a same resistance value, which, in certain implementations can range from a few ohms to tens of kilo-ohms. The voltage selector 300, as shown in FIG. 3, further includes diodes 315 and 320, which, in the event of a sufficiently large voltage difference between respective voltages applied on the input terminal 208 and 210 (e.g., a differential voltage greater than a forward bias voltage of the diodes 315 or 320), can balance that voltage difference to provide protection to the circuit elements of differential amplifiers of a CSA (e.g., CSA 100, CSA 200) that are coupled with, and are being supplied power by the voltage selector 300.

As illustrated in FIG. 3, a first floating voltage supply rail, the V_INPUT rail of FIG. 2, and a second floating voltage supply rail, the V_N_MAIN rail of FIG. 2, are coupled with the resistor 305, such that a voltage supplied on the V_INPUT rail and the V_N_MAIN rail will track with a voltage applied to the input terminal 208 (e.g., will track with a common mode voltage of an applied differential voltage). As shown in FIG. 2, the V_INPUT rail can be coupled with (e.g., supply power to) the input chopper 228. As also shown in FIG. 2, and further in FIGS. 5 and 6, the V_N_MAIN rail can be coupled with (e.g., supply power to), at least a portion of a differential amplifier ($A_{MAIN}$) 224 of a main (feed-forward) amplifier path, such as one of a plurality of input stages of the differential amplifier 224.

As further illustrated in FIG. 3, a third floating voltage supply rail, the V_N_NULL rail, is coupled with the resistor 310, such that a voltage supplied on the V_N_NULL rail will track with a voltage applied to the input terminal 210 (e.g., will track with a common mode voltage of an applied differential voltage). As shown in FIG. 2, and further in FIGS. 5 and 6, the V_N_NULL rail can be coupled with (e.g., supply power to), at least a portion of a differential amplifier ($A_{NULL}$) 226 of a null (chopper-stabilized) amplifier path, such as one of a plurality of input stages of the differential amplifier 226.

In the voltage selector 300, a Schottky diode 325 and a high-voltage PMOS device 330 are configured to select a higher voltage between a voltage applied on the input terminal 208 (e.g., IN+ differential input terminal) and VDD_INT, where that selected voltage is then applied to a fourth floating voltage supply rail, the V_P_MAIN rail of the CSA 200. As shown in FIG. 2, and further in FIGS. 5 and 6, the V_P_MAIN rail can be coupled with (e.g., supply power to) at least a portion of the differential amplifier ($A_{MAIN}$) 224 of the main (feed-forward) amplifier path of the CSA 200, such as one of a plurality of input stages of the differential amplifier 224 shown in FIG. 2.

Further in the voltage selector 300, a Schottky diode 335 and a high-voltage PMOS device 340 are configured to select a higher voltage between a voltage applied on the input terminal 210 (e.g., IN– differential input terminal) and VDD_INT, where that selected voltage is then applied to a fifth floating voltage supply rail, the V_P_NULL rail of the CSA 200. As shown in FIG. 2, and further in FIGS. 5 and 6, the V_P_NULL rail can be coupled with (e.g., supply power to), at least a portion of the differential amplifier ($A_{NULL}$) 226 of the null (chopper-stabilized) amplifier path of the CSA 200, such as one of a plurality of input stages of the differential amplifier 226 shown in FIG. 2.

Figure 4:
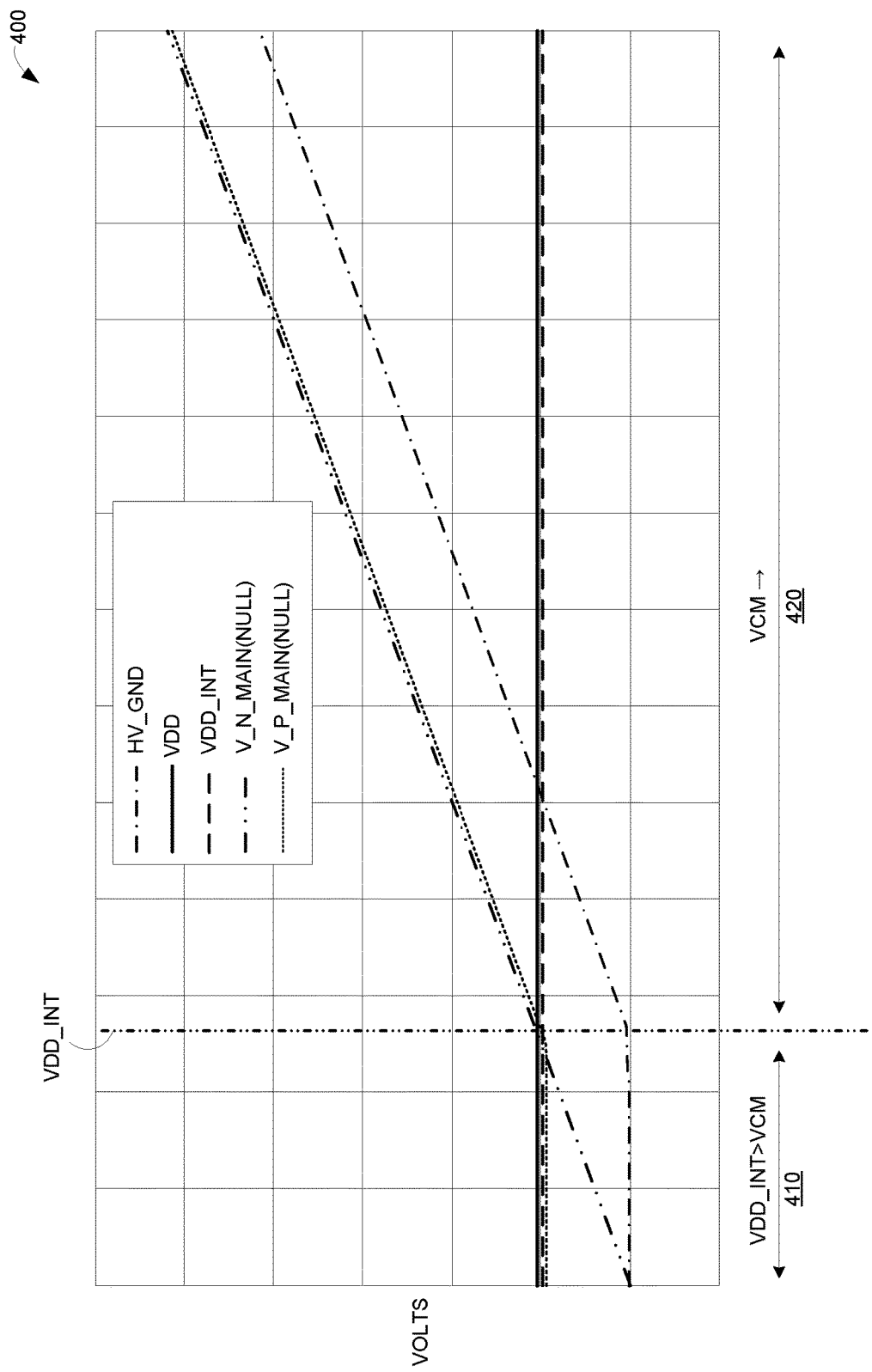
FIG. 4 is a graph illustrating operation of the voltage selector circuit of FIG. 3.

As further shown in FIG. 3, the voltage selector 300 can include a voltage regulator 345 (e.g., implemented using one or more Zener diodes or other voltage regulator circuit) that generates a floating ground reference, the HV_GND reference, from a higher voltage of the V_P_MAIN rail and the V_P_NULL rail. Accordingly, when the common mode voltage is above VDD_INT, the floating ground reference, HV_GND, will track (float) in accordance with the common mode voltage of a differential voltage applied to a corresponding CSA, such as the CSA 200 of FIG. 2, such as is illustrated in FIG. 4. The voltage selector 300 can also include a current sink 350 for current supplied (e.g., to the amplifier paths of the CSA 200) by the V_P_MAIN and V_P_NULL floating voltage supply rails, as well as bias current for the voltage regulator (e.g., Zener diode) 345.

FIG. 4 is a graph 400 illustrating operation and various voltages (VOLTS) of the voltage selector 300 of FIG. 3. In the graph 400, operation of the voltage selector 300 is illustrated over a range of common mode voltages VCM. The graph 400 illustrates traces for the floating ground reference HV_GND of the voltage selector 300, the externally applied supply voltage VDD, the internally regulated supply voltage VDD_INT, the V_N_MAIN and V_N_NULL floating voltage supply rails (as a single trace), and the V_P_MAIN and V_P_NULL floating voltage supply rails (as a single trace). As noted above, in this example implementation, the V_INPUT rail is coupled with a same node of the voltage selector 300 at the V_N_MAIN rail, so will have a same voltage (substantially a same voltage) as the V_N_MAIN rail illustrated in FIG. 4 and will track with the common mode voltage VCM.

For purposes of illustration, the various traces (as identified by the legend in FIG. 4) are shown with some separation so they can be distinguished from one another. In implementations of the voltage selector 300, voltages corresponding with such traces in FIG. 4 can be equal (approximately equal, substantially equal, etc.). For instance, in this example implementation, VDD and VDD_INT are shown in FIG. 4 as being equal (substantially equal) and having a constant value over the illustrated range of common mode voltage VCM. However, as discussed above, VDD_INT could be stepped down (less than) VDD, such as discussed above, depending on the particular implementation.

In FIG. 4, two operation regions are indicated, a region 410 and a region 420. In the region 410, VDD_INT is greater than a common mode voltage VCM that is applied to the differential inputs 208 and 210 (e.g., of the CSA 200 of FIG. 2 and the voltage selector 300 of FIG. 3). In the region 420, the common mode voltage VCM is greater than VDD_INT. The point where the common mode voltage VCM is equal to VDD and VDD_INT in the graph 400 is shown by the vertical, dashed line that is referenced with VDD_INT. In the region 410, the voltage regulator 345 of the voltage selector 300 can be configured such that the floating ground reference HV_GND is equal to (substantially equal to) the externally supplied ground reference GND while VCM is less than VDD_INT. As also illustrated in FIG. 4, in the region 420, the voltage regulator 345 can be configured such that, when VCM is greater than VDD_INT, the HV_GND reference follows (tracks with VCM) at a voltage that is lower than VCM by a quantity set by the voltage regulator 345, to provide a common voltage supply reference for the V_P_MAIN rail and the V_P_NULL rail of the voltage selector 300 and allow for shifting of input signal voltages into the operating voltage range (e.g., between VDD_INT and GND) of a corresponding CSA, such as the CSA 200 shown in FIG. 2.

FIG. 5 is a block diagram illustrating a differential amplifier 500 that can be implemented in the CSA 200 of FIG. 2 and using the voltage selector 300 of FIG. 3 for the voltage selector 220 of the CSA 200. For instance, the differential amplifier 500 can be used to implement the $A_MA_{IN}$ amplifier 224 and the $A_{NULL}$ amplifier 226. Accordingly, in the following description of the differential amplifier 500, further reference is made to the CSA 200 of FIG. 2 and the voltage selector 300 of FIG. 2. As parenthetically indicated in FIG. 5, the $A_MA_{IN}$ amplifier 224 can include a secondary input stage (e.g., a $B_M$ stage 530 configured to receive the first differential output voltage from the null amplifier path of the CSA 200). In some implementations, the $A_{NULL}$ amplifier 226 can omit (not include) the $B_M$ stage 530.

As shown in FIG. 5, the differential amplifier 500 can be coupled to the differential input terminals 208 and 210 of the CSA 200 to receive a differential voltage that is to be amplified by the CSA 200. In the case of the $A_{NULL}$ amplifier 226 of the CSA 200, the input terminals 208 and 210 of the differential amplifier 500 can be coupled with the differential output terminals of the input chopper 228, as is shown in FIG. 2.

The differential amplifier 500 can also be coupled with (can receive, can be provided with, etc.) VDD, VDD_INT, HV_GND and GND. When implemented as the $A_{MAIN}$ amplifier 224 of the CSA 200, the differential amplifier 500 can be further coupled with the V_P_MAIN and V_N_MAIN floating voltage supply rails of the voltage selector 300. Likewise, when implemented as the $A_{NULL}$ amplifier 226 of the CSA 200, the differential amplifier 500 can be further coupled with the V_P_NULL and V_N_NULL floating voltage supply rails of the voltage selector 300. In the following discussion of the differential amplifier 500 (and in the discussion of FIGS. 5 and 6 below), the floating power supply rails are referred to jointly as V_P_MAIN(NULL) and V_N_MAIN(NULL), where the particular supply rails (e.g., MAIN or NULL) used will depend on whether the differential amplifier 500 is implemented in the main amplifier path (e.g., as the $A_{MAIN}$ amplifier 224) or the null amplifier path (e.g., as the $A_{NULL}$ amplifier 226) of the CSA 200.

As shown in FIG. 5, the differential amplifier 500 can include a PMOS input stage (PMOS stage) 510, an NMOS input stage (NMOS stage) 520, the $B_M$ input stage 530 (e.g., for the $A_MA_{IN}$ amplifier 224), summing points 540 and an output stage 550 that provides an amplified differential output voltage on differential output terminal OUT+ and OUT– that is based on the differential input voltage received by the differential amplifier 500. As shown in FIG. 5, differential outputs from the PMOS stage 510, the NMOS stage 520 and the $B_M$ input stage (e.g., for the $A_{MAIN}$ amplifier 224) can be provided to summing points 540, where those differential outputs are combined and a resultant differential voltage is provided to the output stage 550 of the differential amplifier 500. The output stage 500 can then produce (e.g., from the combined differential outputs from the various input stage) an amplified differential output voltage on the OUT+ and OUT− terminals based on the resultant differential voltage received from the summing points 540.

In the differential amplifier 500, the PMOS stage 510 is biased between (e.g., powered by) the VMAX_P_MAIN (NULL) floating voltage supply rail and HV_GND, while the NMOS stage 520 is biased between (e.g., powered by) the VMAX_N_MAIN(NULL) floating voltage supply rail and HV_GND. Accordingly, the supply voltage for the NMOS stage 520 follows (tracks with) VCM, such as was described above with respect to the voltage selector 300 (and the graph 400), while the supply voltage for the PMOS stage 510 follows (tracks with) a greater of VDD_INT and VCM, such as was also described above with respect to the voltage selector 300 (and illustrated in the graph 400).

For the $A_{MAIN}$ amplifier 224, the $B_M$ input stage 530 (which can be implemented as a PMOS input stage, such as the PMOS input stage 510) can be biased between (powered by) VDD_INT and GND. As is shown in FIG. 5, for the $A_{MAIN}$ amplifier 224, the output stage 550 of the differential amplifier 500 and can be biased between VDD and GND, while for the $A_{NULL}$ amplifier 226, the output stage 550 of the differential amplifier 500 can be biased between VDD_INT and GND. Such biasing of the input stages 510 and 520, and the output stage 550 of the differential amplifier 500 can provide for accurate translation (shifting) of the input signals (e.g., differential input signals having a VCM greater than VDD and/or VDD_INT into the operating voltage supply range (e.g., VDD and/or VDD_INT) of the CSA 200 and, accordingly, achieve separation of the CSA 200's input voltage ranges (e.g., across the VCM range) and output voltage ranges (e.g., VDD and/or VDD_INT) can be obtained.

The differential amplifier 500 also includes a transconductance (gm) control circuit (gm control) 560 that is coupled between the PMOS stage 510 and the NMOS stage 520. An example implementation of the PMOS stage 510, the gm control 560 and the NMOS stage 520 of the differential amplifier 500 is shown in circuit schematic form in FIG. 6. Briefly, however, in the differential amplifier 500, the PMOS stage 510 controls the operation of the gm control 560. The gm control 560, in turn, controls the functionality (operation) of the NMOS stage 520. That is, the gm control 560, based on operation of the PMOS stage 510, turns the NMOS stage 520 on and off (e.g., by regulating or controlling a tail current of the NMOS stage 520 in certain implementations). For instance, in the differential amplifier 500, when the PMOS input stage 510 is operating (e.g., a VCM below VDD_INT), the gm control can be configured to disable (turn off, etc.) the NMOS stage (e.g., by preventing flow of a tail current of the NMOS stage 520). Further in the differential amplifier 500, when a VCM of an applied differential voltage rises (e.g., approaches and/or exceeds VDD_INT), the PMOS stage 510 will begin to turn off, or will turn off, which can cause the gm control 560 to turn on the NMOS stage (e.g., allow for flow of a tail current of the NMOS stage 520).

FIG. 6 is a schematic diagram 600 illustrating a portion of an implementation of the differential amplifier 500 of FIG. 5. The schematic diagram 600 of FIG. 6 illustrates, for instance, the PMOS input stage 510, the NMOS input stage 520 and the gm control 560 of the differential amplifier 500. For purposes of clarity, the additional elements of the differential amplifier 500 are not shown in FIG. 6.

In the schematic 600, the circuit elements that correspond with the PMOS input stage 510, the NMOS input stage 520 and the gm control 560, as well as additional circuit elements (e.g., such as circuit elements of the overall input stage), are specifically referenced and discussed below. Accordingly, further reference is made to FIG. 5 in the following discussion of the schematic 600. Additionally, further reference is made to the other drawings of the application in the discussion of FIG. 6 below, as is appropriate for describing the example implementation in the schematic 600.

The other elements of the schematic 600 (e.g., elements that are not specifically referenced in FIG. 6) are shown by way of illustration and context. Those elements that are not specifically referenced in FIG. 6, in this example implementation, work in conjunction with the elements of the PMOS input stage 510, the NMOS input stage 520, the overall input stage, and the gm control 560, such as by providing biasing, signaling, and/or current mirroring, etc.

In the schematic 600, the PMOS stage 510 of the differential amplifier 500 can include a current source 602, and p-type metal-oxide semiconductor (PMOS) transistors 604 and 608. The NMOS stage 520 of the differential amplifier 500 can include n-type metal-oxide semiconductor (NMOS) transistors 620, 622. The overall input stage (e.g., the combination of the PMOS stage 510 and the NMOS stage 520) can further include PMOS transistors 610, 612, 614, 616, 624, 626, 628, 630, 632 and 634; and NMOS transistors 618 and 636. The NMOS transistors 663 and 664 are configured so as to operate as a tail current source for the NMOS stage 520 (e.g., NMOS transistors 620 and 622).

As shown in FIG. 6, the overall input stage (e.g., the PMOS stage 510 and the NMOS stage 520) can produce biasing currents $I_{OUT\_P}$ and $I_{OUT\_M}$ of the differential amplifier 500, which can be used for common mode voltage rejection when amplifying a differential voltage applied to the differential amplifier 500. Accordingly, in some implementations, the biasing currents $I_{OUT\_P}$ and $I_{OUT\_M}$ should be constant across the common mode voltage VCM range of a corresponding CSA, such as the CSA 200. This can be achieved for the differential amplifier 500 using the gm control 560.

As noted above, the gm control 560 of the differential amplifier 560 can control operation of the NMOS stage 220 (e.g., turn the NMOS stage on and off), based on operation of the PMOS stage 510, by controlling a tail current of the NMOS stage 520 through the NMOS transistors 663 and 664, such as is discussed further below. However, in certain implementations, the gm control 560 can control operation of the PMOS stage 510 based on operation of the NMOS stage 520.

In the schematic 600, the gm control 560 of the differential amplifier 500 can be implemented using yet another PMOS input stage (e.g., in addition to the PMOS input stage 510 and the $B_M$ stage 530 of the $A_{MAIN}$ amplifier 224). The gm control 560 of FIG. 5, as shown in the schematic 600, can include a current source 640, a PMOS input stage including PMOS transistors 641, 642, as well as PMOS transistors 645, 646, 647 and 648, and NMOS transistors 643, 644, 653, 657 and 672.

As discussed herein, the gm control 560 of the differential amplifier 500 can serve multiple purposes. For instance, the gm control 560 can be configured to maintain a transconductance of the overall input stage of the differential amplifier 500 (e.g., a combined transconductance of the PMOS stage 510 and the NMOS stage 520) at a constant (approximately constant) transconductance across an entire common mode voltage VCM range for differential voltage inputs of a corresponding CSA, such as the CSA 200. The gm control 560 can also be configured (e.g., in differential amplifier 500 as shown in the schematic 600) to maintain the $I_{OUT\_P}$ and $I_{OUT\_M}$ biasing currents (e.g., for common mode rejection) constant across the entire VCM input range.

In the implementation of the schematic 600, the gm control 560 can achieve these purposes by the operation of the secondary PMOS input stage of the gm control 560 operating in parallel with the PMOS input stage 510, as shown in FIG. 6. In this implementation, the current source 640 and the PMOS transistors 641 and 642 of the gm control 560 generate a control current $I_{CTRL}$, as shown in FIG. 6. The current $I_{CTRL}$ can be used to achieve the foregoing described functions of the gm control 560 by controlling bias conditions for various elements of the schematic 600, such as described below.

For instance, constant (approximately constant, substantially constant, etc.) transconductance of the overall input stage (e.g., the combined transconductance of the PMOS stage 510 and the NMOS stage 510) can be achieved by controlling current through the tail current source of the NMOS stage 520 that is implemented, in the schematic 600, e.g., by the NMOS transistors 663 and 664, which, in turn, controls current through the NMOS transistors 620 and 622 of the NMOS input stage 520. For instance, when the PMOS stage of the gm control 560 is operating (e.g., PMOS transistors 641 and 642 are conducting), the NMOS transistor 653 of the gm control 560 conducts (diverts, etc.) an $I_{BIAS}$ current from the NMOS transistor 661. As a result, current flow through the NMOS transistor 661, the PMOS transistor 663 and the tail current source NMOS transistor 663 is at, or near zero, which shuts of the NMOS stage 520.

As a common mode voltage VCM of a differential voltage applied to the terminal 208 and 210 of the differential amplifier 500 (and the schematic 600) rises (e.g., is less than but approaching VDD_INT), the PMOS input stage of the gm control begins to shut down. As a result, an amount of the $I_{BIAS}$ current conducted through the NMOS transistor 653 decreases, and the NMOS transistor 661, the PMOS transistor 662 and the NMOS transistor 663 (as well as the NMOS transistor 664) of the tail current course of the NMOS input stage begin to conduct a current difference between $I_{CTRL}$ and $I_{BIAS}$.

The gm control 560 further operates, as described below, to maintain the $I_{OUT\_P}$ and $I_{OUT\_M}$ biasing currents constant over an entire VCM range for a given CSA. For instance, in the schematic 600, the gm control 560 can be configured to maintain the $I_{OUT\_P}$ and $I_{OUT\_M}$ biasing currents constant by changing a multiplicity of the NMOS transistors 670 and 671, depending on which input stage (e.g., of the PMOS stage 510 and the NMOS stage 520) is operating (though the transition may be gradual, depending on an applied VCM). In certain implementations of the differential amplifier 500 (and the schematic 600), when the PMOS stage 510 is active, the NMOS transistors 657 and 672 are added (e.g., conduct current) in parallel with, respectively, the NMOS transistors 670 and 671. These added transistors 657 and 672 can conduct the $I_{OUT\_P}$ and $I_{OUT\_M}$ biasing currents and an output current of the PMOS 510 stage. When the NMOS stage 520 is active, the NMOS transistors 657 and 672 can be turned off and the NMOS transistors 670 and 671 can conduct the $I_{OUT\_P}$ and $I_{OUT\_M}$ biasing currents and the output current from the NMOS stage 520. In the implementation of FIG. 6, operation of the NMOS transistors 657 and 672 can be controlled by the $I_{CTRL}$ current. By adding/removing the NMOS transistors 657 and 672 based on operation of the PMOS stage 510 (and the gm control 560) a constant (approximately constant, substantially constant, etc.) bias current through the PMOS transistors 612 and 628 can be achieved.

Implementing a differential amplifier 500 such as illustrated in FIGS. 5 and 6, in combination with the voltage selector block 300 of FIG. 3, only two high voltage devices can be used, PMOS transistors 614 and 634, to withstand high voltage drops (e.g., for common mode voltages VCM that are greater than VDD_INT of a given CSA, such as the CSA 200). This allows for the use of low voltage transistors in the signal path of the differential amplifier 500, which can provide certain advantages, such as better device matching, lower noise and/or or lower offsets.

Figure 7:
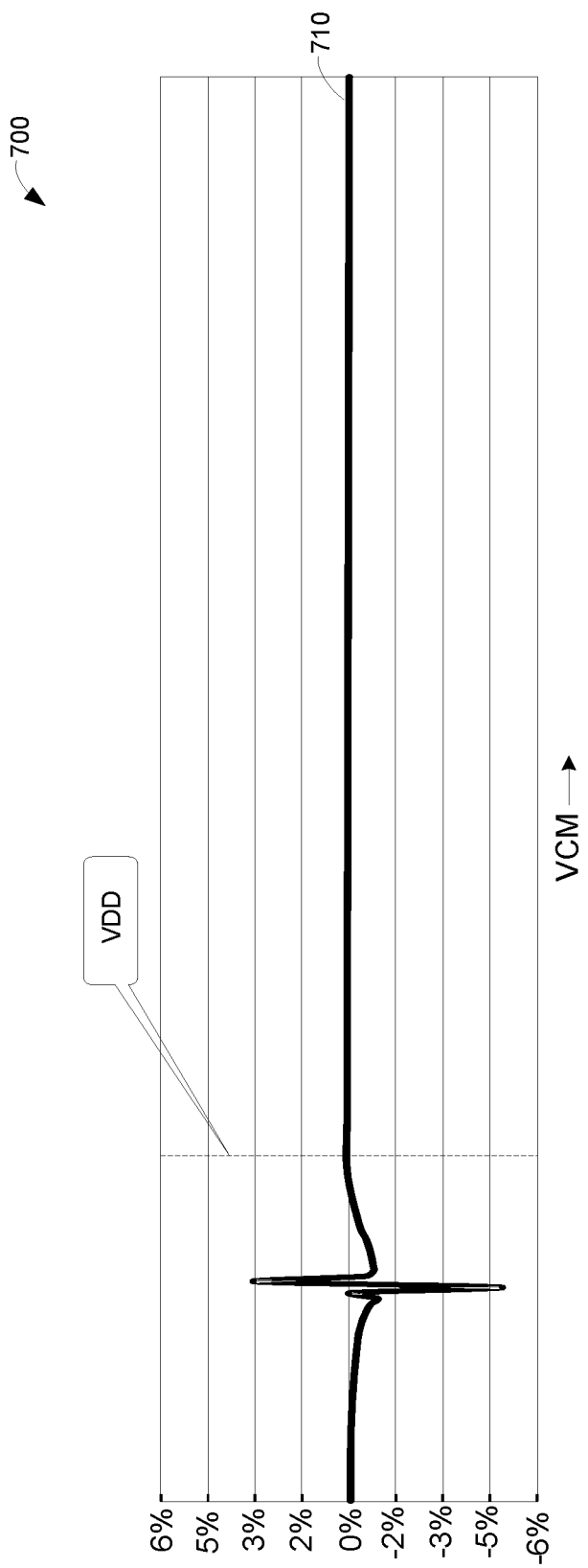
FIG. 7 is a graph illustrating normalized transconductance measurements of an implementation of the current sense amplifier of FIG. 2 across a range of common mode voltages.

FIG. 7 is a graph 700 illustrating normalized transconductance variation for an implementation of the current sense amplifier of FIG. 2 across a range of common mode voltages. That is, the graph 700 shows a trace 710 that illustrates normalized transconductance for overall transconductance for the input stages of an implementation of the differential amplifier of FIGS. 5 and 6, where the transconductance is regulated by a gm compensation circuit, such as the gm compensation 560 of FIG. 5 and the example implementation of the gm compensation circuit of 560 described with respect to the differential amplifier 600 of FIG. 6.

In FIG. 7, normalized transconductance is shown, by the trace 710, for an implementation of a differential amplifier, such as for an implementation of the differential amplifier of FIGS. 5 and 6, across a range of common mode voltages (VCM) for a corresponding CSA. As shown by the trace 710 in FIG. 7, the normalized transconductance (e.g., in a PMOS-NMOS transition region, where a common mode voltage applied to the differential inputs 208 and 210 of the CSA approaches a VDD_INT of the CSA, the PMOS input stage 510 begins to shut down and the NMOS input stage 520 begins to turn on), varies, initially, by approximately minus five percent (−5%), then by approximately plus three percent (+3%). As also shown by the trace 710, for the illustrated implementation, other than the transconductance variation in the PMOS-NMOS transition region, the normalized transconductance variation across the illustrated range of common mode voltages is approximately zero (e.g., for common mode voltages from 0 V to 26 V and a VDD_INT of 5 V, or less, in some implementations).

In a general aspect, a current sense amplifier circuit (CSA) can include a null amplifier path configured to receive a differential input voltage and to output a first differential output voltage based on the differential input voltage. The CSA can also include a main amplifier path configured to receive the differential input voltage; receive the first differential output voltage; and output a second differential output voltage based on the differential input voltage and the first differential output voltage. Each of the null amplifier path and the main amplifier path can include a differential amplifier having a first input stage and a second input stage that are each configured to receive the differential input voltage. The first input stage of the main amplifier path can be powered by a first floating voltage supply rail that is referenced to a floating ground rail, and the second input stage of the main amplifier path can be powered by a second floating voltage supply rail that is referenced to the floating ground rail. The first input stage of the null amplifier path can be powered by a third floating voltage supply rail that is referenced to the floating ground rail, and the second input stage of the null amplifier path can be powered by a fourth floating voltage supply rail that is referenced to the floating ground rail.

Implementations can include on or more of the following features. For example, the differential amplifier of the main amplifier path can include a third input stage configured to receive the first differential output voltage from the null amplifier path. The third input stage can be powered from a constant internal supply voltage of the CSA and an externally supplied ground voltage of the CSA.

At least one of the differential amplifier of the main amplifier path and the differential amplifier of the null amplifier path can include a transconductance compensation circuit coupled between the first input stage and the second input stage. The transconductance compensation circuit can be configured to control operation of the second input stage based on operation of the first input stage. The transconductance compensation circuit can be configured to, based on operation of the first input stage, produce a current that biases one or more transistors of the differential amplifier to regulate a tail current of the second input stage.

The first floating voltage supply rail and the second floating voltage supply rail can be operationally coupled with a first differential input of the CSA. The third floating voltage supply rail and the fourth floating voltage supply rail can be operationally coupled with a second differential input of the CSA.

The CSA can include a voltage selection circuit that is configured to receive a first differential input signal of the differential input voltage; receive a second differential input signal of the differential input voltage and receive an internal supply voltage of the CSA. The voltage selection circuit can also be configured to select a first voltage having a highest value from the first differential input signal, and the internal supply voltage; apply the selected first voltage to the first floating voltage supply rail; select a second voltage having a highest value from the second differential input signal, and the internal supply voltage; and apply the selected second voltage to the third floating voltage supply rail.

The voltage selection circuit can be configured to apply the first differential input signal to the second floating voltage supply rail; and apply the second differential input to the fourth floating voltage supply rail. The voltage selection circuit can be an analog voltage selection circuit. The voltage selection circuit can include a voltage regulator configured to determine, from at least one of the selected first voltage and the selected second voltage, a floating ground voltage that is applied to the floating ground rail.

The CSA can include a voltage regulator configured to produce the internal supply voltage from an external supply voltage. The CSA can include an output amplifier configured to receive the second differential output voltage and provide an amplified output voltage that is proportional to the differential input voltage, the output amplifier being powered by the external supply voltage and an externally applied electrical ground voltage of the CSA.

The null amplifier path can be a chopper-stabilized amplifier path including: an input chopper coupled with an input side of the differential amplifier of the chopper-stabilized amplifier path, the input chopper being powered by a fifth floating voltage supply rail that is referenced to the floating ground rail; an output chopper coupled with an output side of the differential amplifier of the chopper-stabilized amplifier path, the output chopper being powered by the internal supply voltage and an externally supplied ground voltage of the CSA; and a notch filter (or other filter) coupled with the output chopper. The notch filter (or other filter) can be configured to provide the first differential output voltage to the differential amplifier of the main amplifier path. The voltage selection circuit can be configured to apply the first differential input signal to the fifth floating voltage supply rail.

In another general aspect, a current sense amplifier circuit (CSA) can include a null amplifier path configured to receive a differential input voltage and to output a first differential output voltage based on the differential input voltage. The CSA can also include a main amplifier path configured to: receive the differential input voltage; receive the first differential output voltage; and output a second differential output voltage based on the differential input voltage and the first differential output voltage. Each of the null amplifier path and the main amplifier path can include a differential amplifier having: a first input stage configured to receive the differential input voltage; a second input stage configured to receive the differential input voltage; and a transconductance compensation circuit coupled between the first input stage and the second input stage. The transconductance compensation circuit can be configured to control operation of the second input stage based on operation of the first input stage.

Implementations can include one or more of the following features. For example, the transconductance compensation circuit can be configured to, based on operation of the first input stage, produce a current that biases one or more transistors of the differential amplifier to regulate a tail current of the second input stage. The transconductance compensation circuit can be configured to turn on the second input stage in response to the first input staging turning off. The first input stage can be configured to turn off in response to a common mode voltage of the differential input voltage being above a threshold voltage.

The first input stage of the differential amplifier can be a p-type metal oxide semiconductor (PMOS) transistor input stage. The second input stage can be an n-type metal oxide semiconductor (NMOS) transistor input stage.

The differential amplifier of the main amplifier path can include a third input stage configured to receive the first differential output voltage from the null amplifier path. The second differential output voltage can be a sum of: a differential output of the first input stage of the differential amplifier of the main amplifier path; a differential output of the second input stage of the differential amplifier of the main amplifier path; and a differential output of the third input stage of the differential amplifier of the main amplifier path.

In another general aspect, a current sense amplifier circuit (CSA) can include a null amplifier path configured to receive a differential input voltage and to output a first differential output voltage based on the differential input voltage. The CSA can include a main amplifier path configured to: receive the differential input voltage; receive the first differential output voltage; and output a second differential output voltage based on the differential input voltage and the first differential output voltage. Each of the null amplifier path and the main amplifier path can include a differential amplifier having a first input stage and a second input stage that are each configured to receive the differential input voltage. The first input stage of the main amplifier path can be powered by a first floating voltage supply rail that is referenced to a floating ground rail. The second input stage of the main amplifier path can be powered by a second floating voltage supply rail that is referenced to the floating ground rail.

Implementations can include one or more of the following features. For example, the first input stage of the main amplifier path can be a p-type metal oxide semiconductor (PMOS) transistor input stage. The second input stage of the main amplifier path can be an n-type metal oxide semiconductor (NMOS) transistor input stage.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a circuit element, etc., is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A current sense amplifier circuit comprising:
    a null amplifier path configured to receive a differential input voltage and to output a first differential output voltage based on the differential input voltage; and
    a main amplifier path configured to:
        receive the differential input voltage;
        receive the first differential output voltage; and
        output a second differential output voltage based on the differential input voltage and the first differential output voltage,
    each of the null amplifier path and the main amplifier path including a differential amplifier having a first input stage and a second input stage that are each configured to receive the differential input voltage,
    the first input stage of the main amplifier path being powered by a first floating voltage supply rail that is referenced to a floating ground rail,
    the second input stage of the main amplifier path being powered by a second floating voltage supply rail that is referenced to the floating ground rail,
    the first input stage of the null amplifier path being powered by a third floating voltage supply rail that is referenced to the floating ground rail, and
    the second input stage of the null amplifier path being powered by a fourth floating voltage supply rail that is referenced to the floating ground rail.

2. The current sense amplifier circuit of claim 1, wherein the differential amplifier of the main amplifier path includes a third input stage configured to receive the first differential output voltage from the null amplifier path, the third input stage being powered from a constant internal supply voltage of the current sense amplifier circuit that is referenced to an externally supplied ground voltage of the current sense amplifier circuit.

3. The current sense amplifier circuit of claim 1, wherein at least one of the differential amplifier of the main amplifier path and the differential amplifier of the null amplifier path includes a transconductance compensation circuit coupled between the first input stage and the second input stage, the transconductance compensation circuit being configured to control operation of the second input stage based on operation of the first input stage.

4. The current sense amplifier circuit of claim 3, wherein the transconductance compensation circuit is configured to, based on operation of the first input stage, produce a current that biases one or more transistors of the differential amplifier to regulate a tail current of the second input stage.

5. The current sense amplifier circuit of claim 1, wherein:
    the first floating voltage supply rail and the second floating voltage supply rail are operationally coupled with a first differential input of the current sense amplifier circuit; and
    the third floating voltage supply rail and the fourth floating voltage supply rail are operationally coupled with a second differential input of the current sense amplifier circuit.

6. The current sense amplifier circuit of claim 1, further comprising a voltage selection circuit that is configured to:
    receive a first differential input signal of the differential input voltage;
    receive a second differential input signal of the differential input voltage;
    receive an internal supply voltage of the current sense amplifier;
    select a first voltage having a highest value from the first differential input signal, and the internal supply voltage;
    apply the selected first voltage to the first floating voltage supply rail;
    select a second voltage having a highest value from the second differential input signal, and the internal supply voltage; and
    apply the selected second voltage to the third floating voltage supply rail.

7. The current sense amplifier circuit of claim 6, wherein the voltage selection circuit is further configured to:
apply the first differential input signal to the second floating voltage supply rail; and
apply the second differential input signal to the fourth floating voltage supply rail.

8. The current sense amplifier circuit of claim 6, wherein the voltage selection circuit is an analog voltage selection circuit.

9. The current sense amplifier circuit of claim 6, wherein the voltage selection circuit includes a voltage regulator configured to determine, from at least one of the selected first voltage and the selected second voltage, a floating ground voltage that is applied to the floating ground rail.

10. The current sense amplifier circuit of claim 6, further comprising a voltage regulator configured to produce the internal supply voltage from an external supply voltage.

11. The current sense amplifier circuit of claim 10, further comprising an output amplifier configured to receive the second differential output voltage and provide an amplified output voltage that is proportional to the differential input voltage, the output amplifier being powered by the external supply voltage that is referenced to an externally applied electrical ground voltage of the current sense amplifier.

12. The current sense amplifier circuit of claim 6, wherein the null amplifier path is a chopper-stabilized amplifier path, the chopper-stabilized amplifier path including:
an input chopper coupled with an input side of the differential amplifier of the chopper-stabilized amplifier path, the input chopper being powered by a fifth floating voltage supply rail that is referenced to the floating ground rail;
an output chopper coupled with an output side of the differential amplifier of the chopper-stabilized amplifier path, the output chopper being powered by the internal supply voltage that is referenced to an externally supplied ground voltage of the current sense amplifier circuit; and
a notch filter coupled with the output chopper, the notch filter being configured to provide the first differential output voltage to the differential amplifier of the main amplifier path.

13. The current sense amplifier circuit of claim 12, wherein the voltage selection circuit is further configured to apply the first differential input signal to the fifth floating voltage supply rail.

14. A current sense amplifier circuit comprising:
a null amplifier path configured to receive a differential input voltage and to output a first differential output voltage based on the differential input voltage; and
a main amplifier path configured to:
receive the differential input voltage;
receive the first differential output voltage; and
output a second differential output voltage based on the differential input voltage and the first differential output voltage,
each of the null amplifier path and the main amplifier path including a differential amplifier having:
a first input stage configured to receive the differential input voltage;
a second input stage configured to receive the differential input voltage; and
a transconductance compensation circuit coupled between the first input stage and the second input stage, the transconductance compensation circuit being configured to control operation of the second input stage based on operation of the first input stage.

15. The current sense amplifier circuit of claim 14, wherein the transconductance compensation circuit is configured to, based on operation of the first input stage, produce a current that biases one or more transistors of the differential amplifier to regulate a tail current of the second input stage.

16. The current sense amplifier circuit of claim 14, wherein the transconductance compensation circuit is configured to turn on the second input stage in response to the first input staging turning off, wherein the first input stage is configured to turn off in response to a common mode voltage of the differential input voltage being above a threshold voltage.

17. The current sense amplifier circuit of claim 14, wherein:
the first input stage of the differential amplifier is a p-type metal oxide semiconductor (PMOS) transistor input stage; and
the second input stage is an n-type metal oxide semiconductor (NMOS) transistor input stage.

18. The current sense amplifier circuit of claim 14, wherein the differential amplifier of the main amplifier path includes a third input stage configured to receive the first differential output voltage from the null amplifier path, the second differential output voltage being a sum of:
a differential output of the first input stage of the differential amplifier of the main amplifier path;
a differential output of the second input stage of the differential amplifier of the main amplifier path; and
a differential output of the third input stage of the differential amplifier of the main amplifier path.

19. A current sense amplifier circuit comprising:
a null amplifier path configured to receive a differential input voltage and to output a first differential output voltage based on the differential input voltage; and
a main amplifier path configured to:
receive the differential input voltage;
receive the first differential output voltage; and
output a second differential output voltage based on the differential input voltage and the first differential output voltage,
each of the null amplifier path and the main amplifier path including a differential amplifier having a first input stage and a second input stage that are each configured to receive the differential input voltage,
the first input stage of the main amplifier path being powered by a first floating voltage supply rail that is referenced to a floating ground rail, and
the second input stage of the main amplifier path being powered by a second floating voltage supply rail that is referenced to the floating ground rail.

20. The current sense amplifier circuit of claim 19, wherein:
the first input stage of the main amplifier path is a p-type metal oxide semiconductor (PMOS) transistor input stage; and
the second input stage of the main amplifier path is an n-type metal oxide semiconductor (NMOS) transistor input stage.

* * * * *